United States Patent
Ryu

(10) Patent No.: US 7,687,305 B2
(45) Date of Patent: Mar. 30, 2010

(54) IMAGE SENSOR AND METHOD FOR MANUFACTURING THE SAME

(75) Inventor: Sang-Wook Ryu, Cheongju-si (KR)

(73) Assignee: Dongbu HiTek Co., Ltd, Seoul (KR)

( * ) Notice: Subject to any disclaimer, the term of this patent is extended or adjusted under 35 U.S.C. 154(b) by 232 days.

(21) Appl. No.: 12/046,035

(22) Filed: Mar. 11, 2008

(65) Prior Publication Data
US 2008/0224244 A1    Sep. 18, 2008

(30) Foreign Application Priority Data
Mar. 14, 2007    (KR)    ............... 10-2007-0024920

(51) Int. Cl.
*H01L 21/00*    (2006.01)
*H01L 29/78*    (2006.01)
(52) U.S. Cl. ............... 438/70; 257/432; 257/E51.022; 257/E31.121; 257/E27.134; 257/E27.135
(58) Field of Classification Search ............ 438/70, 438/71; 257/432, 98, E51.022, E31.121, 257/E27.134, E27.135; 348/338, 340; 359/368–398, 359/462–465
See application file for complete search history.

(56) References Cited

U.S. PATENT DOCUMENTS

| 6,940,654 | B1 | 9/2005 | Tang |
| 6,964,916 | B2 * | 11/2005 | Kuo et al. .................... 438/462 |
| 2004/0147059 | A1 | 7/2004 | Jeong et al. |

FOREIGN PATENT DOCUMENTS

KR    10-2007-0023027    2/2007

* cited by examiner

*Primary Examiner*—Davienne Monbleau
*Assistant Examiner*—Monica D Harrison
(74) *Attorney, Agent, or Firm*—Sherr & Vaughn, PLLC

(57) ABSTRACT

An image sensor include an interlayer dielectric layer formed over a semiconductor substrate; a color filter array formed over the interlayer dielectric layer; a planarization layer formed over the color filter; and a microlens array having a continuous, gapless shape formed over the planarization layer and spatially corresponding to the color filter array. The microlens array is composed of a first dielectric layer and a second dielectric layer formed over the first dielectric layer.

20 Claims, 3 Drawing Sheets

IMAGE SENSOR AND METHOD FOR MANUFACTURING THE SAME

Figure 1:
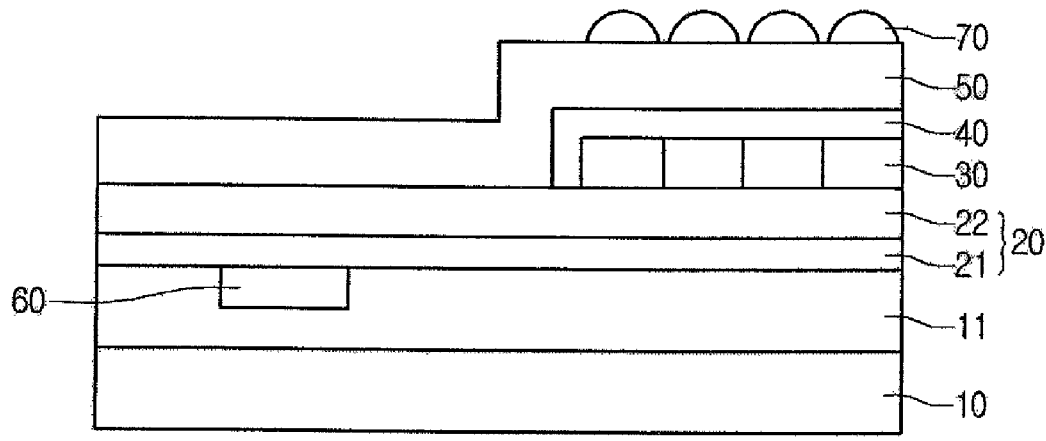

The present application claims priority under 35 U.S.C. 119 and 35 U.S.C. 365 to Korean Patent Application No. 10-2007-0024920 (filed on Mar. 14, 2007), which is hereby incorporated by reference in its entirety.

BACKGROUND

An image sensor is a semiconductor device for converting an optical image into an electrical signal. An image sensor may be classified as a charge coupled device (CCD) image sensor or a complementary metal oxide silicon (CMOS) image sensor.

The CMOS image sensor may include a photodiode and a MOS transistor within a unit pixel for sequentially detecting electrical signals of each unit pixel, thereby implementing an image.

Manufacturing processes of a CMOS image sensor may include forming a microlens by patterning and then reflowing an organic photoresist on and/or over a semiconductor substrate including a unit pixel and relevant devices. However, the organic photoresist may have weak physical properties and thus, the microlens may be easily damaged by physical impact that may result in cracks, etc. in subsequent processes such as a package and bump, etc. The relative viscosity of the organic photoresist is strong so that a defect of the microlens may develop when a particle is absorbed.

SUMMARY

Embodiments relate to a method for manufacturing an image sensor that can include at least one of the following steps: forming an interlayer dielectric layer including a pad over a semiconductor substrate formed with a pixel; sequentially forming a color filter and a planarization layer over the interlayer dielectric layer; forming a first dielectric layer over the planarization layer; forming a microlens array mask over the first dielectric layer; forming a seed microlens array by etching the first dielectric layer using the microlens array mask as an etching mask; forming a microlens array by depositing a second dielectric layer over the seed microlens array and in spaces between neighboring seed microlenses; and then exposing the pad. In accordance with embodiments, etching the first dielectric layer is performed in a chamber using a source power of between 600 to 1400 W at 27 MHz and a bias power of between 0 to 500 W at 2 MHz.

Embodiments relate to an image sensor that can include at least one of the following: an interlayer dielectric layer formed over a semiconductor substrate; a color filter array formed over the interlayer dielectric layer; a planarization layer formed over the color filter; and a microlens array having a continuous, gapless shape formed over the planarization layer and spatially corresponding to the color filter array. In accordance with embodiments, the microlens array is composed of a first dielectric layer and a second dielectric layer formed over the first dielectric layer.

Embodiments relate to a method for manufacturing an image sensor that can include at least one of the following steps: forming an interlayer dielectric layer including a metal pad over a semiconductor substrate; forming a color filter array over the interlayer dielectric layer; forming a planarization layer over the color filter; sequentially forming a first dielectric layer and a microlens array mask over the planarization layer; forming a seed microlens array over the first dielectric layer; forming a microns array having a continuous, gapless shape by depositing a second dielectric layer over the seed microlens array and in spaces between neighboring seed micronlenses; forming a pad mask over the microlens array; forming a pad hole exposing the metal pad; and then removing the pad mask.

DRAWINGS

Example FIGS. 1 to 5 illustrate a method of manufacturing an image sensor, in accordance with embodiments.

DESCRIPTION

As illustrated in example FIG. 1, interlayer dielectric layer 11 can be formed on and/or over semiconductor substrate 10. A photosensor including a photodiode may be formed on and/or over semiconductor substrate 10 per unit pixel. Describing a photosensor including the photodiode, a device isolation film defining an active region and a filed region can be formed on and/or over semiconductor substrate 10. A photodiode for receiving light and generating a photocharge and a corresponding transistor connected thereto for converting the received photocharge into an electrical signal can be formed in a unit pixel of semiconductor substrate 10.

After relevant devices including the device isolation film and the photodiode are formed, interlayer dielectric layer 11 including a metal wire can be formed on and/or over semiconductor substrate 10. Interlayer dielectric layer 11 may have a multilayered structure. The metal wire may be electrically connected to the unit pixel. Also, the metal wire can be formed so as not to shade light incident on the photodiode.

After formation of a metal wire, i.e., pad 60 in interlayer dielectric layer 11, passivation layer 20 can then be formed on and/or over interlayer dielectric layer 11 including pad 60. Passivation layer 20 can serve to protect a device from moisture and scratch, etc. Passivation layer 20 can be composed of at least one of a silicon oxide film, a silicon nitride film and a silicon oxynitride film. Passivation layer can also be formed having a stacked, multilayered structure. For example, passivation layer 20 can be formed in a stacked, multilayered structure including TEOS film 21 having a thickness of between approximately 1,000 to 5,000 Å and a nitride film 22 having a thickness of between approximately 1,000 to 10,000 Å.

Color filter 30 can then be formed on and/or over passivation layer 20. Alternatively, color filter 30 can be formed on and/or over interlayer dielectric layer 11 including pad 60 in order to obtain an image sensor having a reduced thickness and size.

A first pad process for exposing the uppermost surface of pad 60 can be performed on passivation layer 20. The first opening process can form a photoresist pattern having a hole spatially corresponding to pad 60 region on passivation layer 20. Passivation layer 20 can be etched using the photoresist pattern as an etching mask to expose pad 60. After performing the first opening process, a microlens array can be formed and a second pad process may be progressed again. Herein, the first pad open process can be omitted. Hereinafter, the case where the first pad process is omitted will be described by way of example.

As illustrated in example FIG. 1, color filter 30 can be formed on and/or over passivation layer 20 and include a plurality of color filters for implementing a color image. Color filter 30 may be composed of dyed photoresists such that each color filter is formed in each unit pixel to classify colors from the light incident. Color filter 30 can be formed of a plurality of color filters representing a different color such as red, green and blue, so that adjacent color filters 30 are somewhat overlapped with each other to form a step. In order to complement the step of color filter 30, a planarization layer 40 can be formed on and/or over color filter 30. A microlens array formed by a subsequent process can be formed on and/or over planarized layer 40. Accordingly, the step due to color filter 30 can be removed so that planarization layer 40 can be formed on and/or over color filter 30.

First dielectric layer 50 and microlens array mask 70 for forming a microlens array can then be sequentially formed on and/or over color filter 30. First dielectric layer 50 can be formed of at least one of an oxide film, a nitride film and an oxynitride film. For example, first dielectric layer 50 can be formed by depositing an oxide film such as $SiO_2$ at a temperature of about 50 to 250° C. using CVD, PVD, and PEDVD, etc. First dielectric layer 50 can be formed to have a thickness of between 2,000 to 20,000 Å.

Microlens array masks 70 can be formed spaced apart on and/or over first dielectric layer 50, respectively, to spatially correspond to color filters 30 formed per unit pixel. For example, in order to form microlens array mask 70, a photoresist film can be applied on and/or over first dielectric layer 50 and patterned per unit pixel. A reflow process can then be performed on the patterned photoresist film, making it possible to form microlens array masks 70 having a hemispherical shape.

Figure 2:
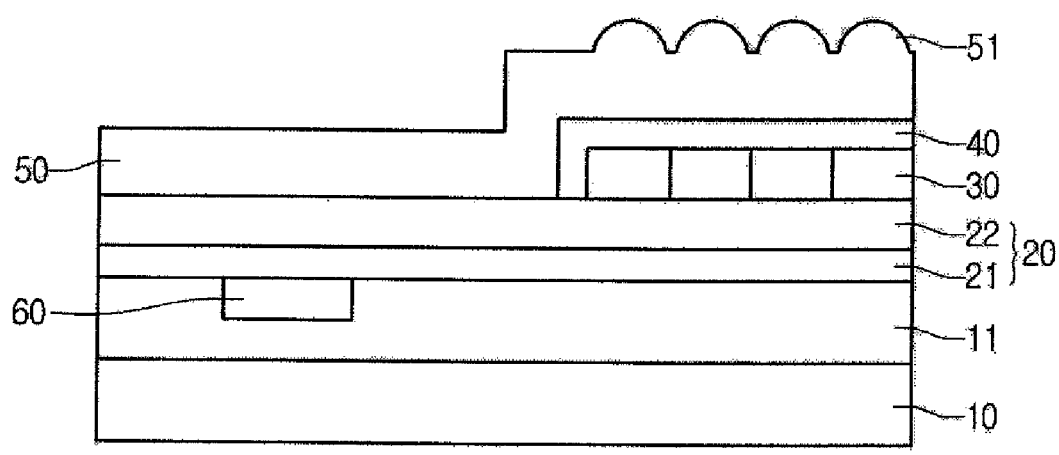

As illustrated in example FIG. 2, seed microlens array 51 can be formed on and/or over an upper region of first dielectric layer 50. Seed microlens array 51 can be formed by implementing an etching process on first dielectric layer 50 using microlens array mask 70 as an etching mask.

The etching of first dielectric layer 50 for forming seed microlens array 51 can use an etching selection ratio between the photoresist film forming microlens array mask 70 and the oxide film forming first dielectric layer 50. For example, the etching selection ratio between microlens array mask 70 and first dielectric layer 50 can be between 1:0.7 to 1.3. Accordingly, the etching of first dielectric layer 50 for forming seed microlens array 51 can be performed until the photoresist film forming microlens array mask 70 is completely etched. Specifically, the etching process on first dielectric layer 50 can be performed in a chamber using an etching gas of $C_xH_yF_z$ (x, y, and z are 0 or natural numbers) and an inert gas such as at least one of Ar, He, $O_2$ and $N_2$. For example, a source power of between 600 to 1400 W at 27 MHz, and a bias power of between 0 to 500 W at 2 MHz can be applied in the chamber, and etching gas composed of $CF_4$ gas of 40 to 120 sccm, and $O_2$ gas of 2 to 20 sccm or Ar gas of 200 to 900 sccm can be injected in the chamber.

First dielectric layer 50 can be etched at a thickness of between 1,000 to 19,000 Å. Seed microlens array 51 can then be formed on the upper region of first dielectric layer 50. For example, seed microlens array 51 can be formed at a thickness of between 2,000 to 6,000 Å. In particular, the process can be progressed so that the bias power is not applied to the inside of the chamber when etching first dielectric layer 50. Then, energy from ions moving from a plasma generated inside the chamber to semiconductor substrate 10 becomes low, making it possible to reduce the damage to first dielectric layer 50 by the etching process. Thereby, it is possible to prevent the occurrence of a dark current by a trap level generated from an interface of semiconductor substrate 10 generated during a plasma process.

As illustrated in example FIG. 2, through the etching process, seed microlens array 51 having a hemispherical shape can be formed on and/or over color filter 30 per unit pixel. Seed microlens array 51 can be formed such that each respective seed microlens is spaced apart from a neighboring seed microlens.

Figure 3:
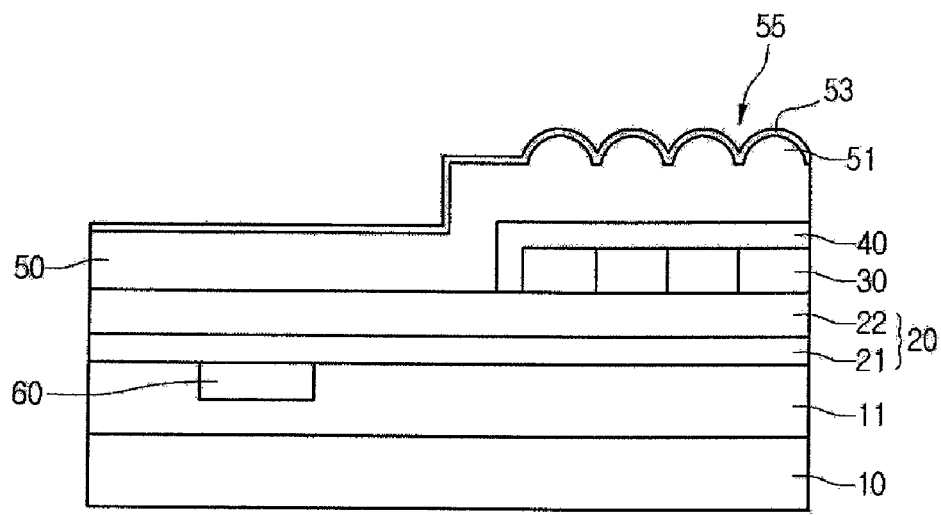
Figure 4:
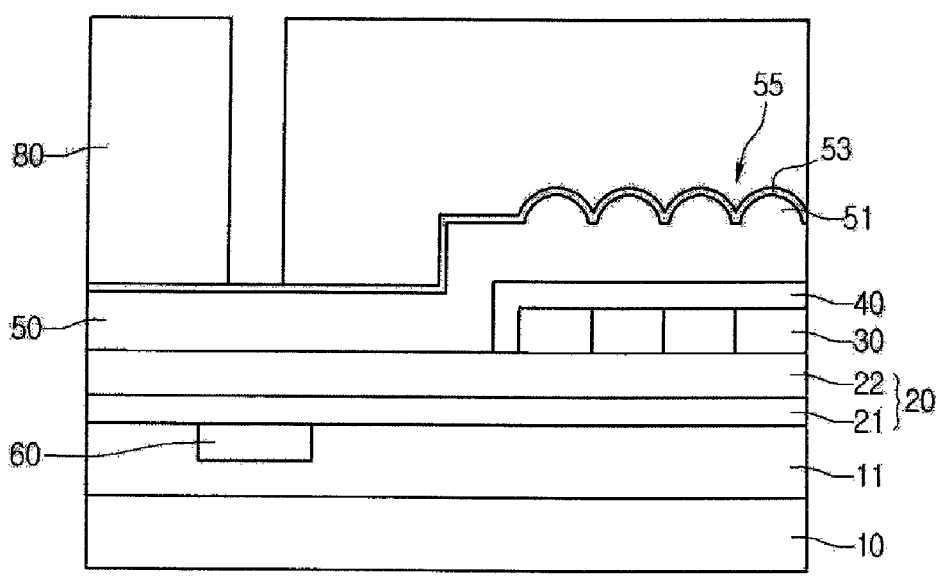

As illustrated in example FIG. 3, second dielectric layer 53 can then be deposited on and/or over seed microlens array 51 to form microlens array 55. Microlens array 55 can be formed such that each respective microlens directly contacts a neighboring microlens in view of its edge due to second dielectric layer 53 being formed on and/or over seed microlens array 51 and in spaces between neighboring seed microlenses. In essence, microlens array 55 can be formed in a continuous, gapless shape.

Second dielectric layer 53 can be composed of the same substance as first dielectric layer 50. For example, second dielectric layer 53 can be formed by depositing an oxide film having a thickness of between 500 to 20,000 Å at a temperature of 50 to 250° C. Second dielectric layer 55 can be deposited until a step of seed microlens is contacted to that of a neighboring seed microlens. Then, a gap between neighboring microlens 55 is reduced to a zero-gap level, having an effect capable of improving image quality of the image sensor.

Figure 5:
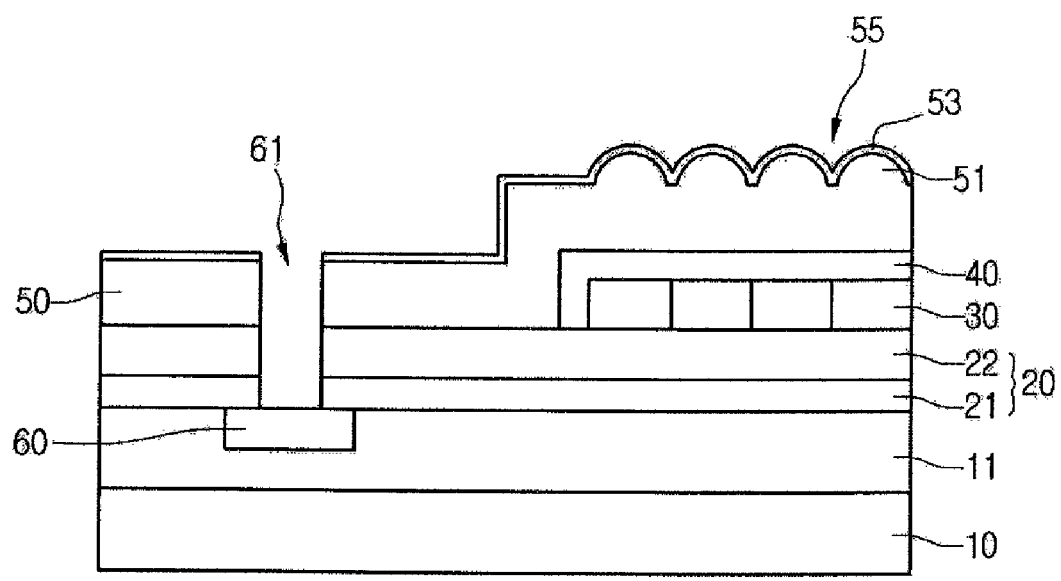

As illustrated in example FIG. 5, pad mask 80 can then be formed on and/or over second dielectric layer 50 including microlens array 55 by applying and then patterning a photoresist film. Pad mask 80 can selectively expose a region of the uppermost surface of second dielectric layer 53 spatially corresponding to pad 60. A hole 61 exposing pad 60 can then be formed by removing second dielectric layer 53, first dielectric layer 50 and passivation layer 20 by using the pad mask as an etching mask. Hole 61 can be formed using the same process as the etching process performed when forming seed microlens array 51. Pad hole 61 can be formed by applying a source power of between 600 to 1400 W at 27 MHz and a bias power of between 0 to 500 W at 2 MHz to the chamber, and injecting an etching gas composed of $C_xH_yF_z$ (x, y, and z are 0 or natural numbers) and an inert gas such as at least one of Ar, He, $O_2$ and $N_2$.

Once pad 60 is exposed, pad mask 80 can then be removed using an ashing process at a temperature of between 0 to 50° C. For example, the removal of pad mask 80 can be performed using $O_2$ gas at a temperature of 0° C. In particular, the temperature provided when removing pad mask 80 can be performed by lowering a temperature of a lower electrode within a chamber in which semiconductor substrate 10 is safely seated. Although the removal of a photoresist film can be generally performed at a temperature above 200° C., the removal of pad mask 80 can be performed in accordance with embodiments at a temperature of 0° C., thus making it possible to prevent a surface of microlens array 55 from being damaged by an ambient temperature.

A method for manufacturing an image sensor in accordance with embodiments can form a microlens array composed of a inorganic substance, thus making it possible to prevent the microlens array from being damaged by subsequent package and bump processes, etc.

Etching damage to the microlens array due to a plasma etching process can also be prevented when forming the microlens array, thus making it possible to prevent the occurrence of a dark current during plasma processing.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming an interlayer dielectric layer including a pad over a semiconductor substrate formed with a pixel;
   sequentially forming a color filter and a planarization layer over the interlayer dielectric layer;
   forming a first dielectric layer over the planarization layer;
   forming a microlens array mask over the first dielectric layer;
   forming a seed microlens array by etching the first dielectric layer using the microlens array mask as an etching mask;
   forming a microlens array by depositing a second dielectric layer over the seed microlens array and in spaces between neighboring seed microlenses; and then
   exposing the pad,
   wherein etching the first dielectric layer is performed in a chamber using a source power of between 600 to 1400 W at 27 MHz and a bias power of between 0 to 500 W at 2 MHz.

2. The method of claim 1, wherein exposing the pad comprises:
   forming a pad mask selectively exposing a second dielectric layer spatially corresponding to the pad;
   etching an upper region of the pad using the pad mask; and then
   removing the pad mask.

3. The method of claim 2, wherein the pad mask is removed using $O_2$ gas at a temperature of between 0 to 50° C.

4. The method of claim 1, wherein etching the first dielectric layer, comprises supplying an etching gas composed of CxHyFz and at least one of Ar, He, $O_2$ and $N_2$ into the chamber.

5. The method of claim 1, wherein after forming the interlayer dielectric layer, a passivation layer is formed over the interlayer dielectric layer.

6. The method of claim 5, wherein the passivation layer is composed of at least one of a silicon oxide film, a silicon nitride film and a silicon oxynitride film.

7. The method of claim 6, wherein the passivation layer has a stacked, multilayered structure.

8. The method of claim 7, wherein the stacked, multilayered structure comprises a lower passivation layer composed of a TEOS film having a thickness of between approximately 1,000 to 5,000 Å and an upper passivation layer composed of a nitride film having a thickness of between approximately 1,000 to 10,000 Å.

9. The method of claim 1, wherein the first dielectric layer and the second dielectric layer are composed of at least one of an oxide film, a nitride film, and an oxynitride film.

10. The method of claim 1, wherein the seed microlens array is formed at a thickness of between approximately 2,000 to 6,000 Å.

11. The method of claim 1, wherein an etching selection ratio between the microlens array mask and the first dielectric layer is between 1:0.7 to 1.3.

12. A method comprising:
    forming an interlayer dielectric layer including a metal pad over a semiconductor substrate;
    forming a color filter array over the interlayer dielectric layer;
    forming a planarization layer over the color filter;
    sequentially forming a first dielectric layer and a microlens array mask over the planarization layer;
    forming a seed microlens array over the first dielectric layer;
    forming a microns array having a continuous, gapless shape by depositing a second dielectric layer over the seed microlens array and in spaces between neighboring seed micronlenses;
    forming a pad mask over the microlens array;
    forming a pad hole exposing the metal pad; and then
    removing the pad mask.

13. The method of claim 12, wherein forming the first dielectric layer comprises depositing an oxide film having a thickness of between 2,000 to 20,000 Å at a temperature of about 50 to 250° C. using at least one of CVD, PVD, and PEDVD.

14. The method of claim 12, wherein the microlens array mask comprises a plurality of microlens masks formed spaced apart over the first dielectric layer and spatially corresponding to a respective color filter in the color filter array.

15. The method of claim 12, wherein forming the seed microlens array comprises performing an etching process on the first dielectric layer using the microlens array mask as an etching mask.

16. The method of claim 12, wherein forming the second dielectric layer comprises depositing an oxide film having a thickness of between 500 to 20,000 Å at a temperature of between 50 to 250° C. over the seed microlens array and in spaces between neighboring seed micronlenses.

17. The method of claim 12, wherein the pad mask is removed by an ashing process using $O_2$ gas at a temperature of 0° C.

18. An apparatus comprising:
    an interlayer dielectric layer formed over a semiconductor substrate;
    a color filter array formed over the interlayer dielectric layer;
    a planarization layer formed over the color filter; and
    a microlens array having a continuous, gapless shape formed over the planarization layer and spatially corresponding to the color filter array,
    wherein the microlens array is composed of a first dielectric layer and a second dielectric layer formed over the first dielectric layer.

19. The apparatus of claim 18, wherein the first dielectric layer and the second dielectric layer each comprise at least one of an oxide film, a nitride film and an oxynitride film.

20. The apparatus of claim 19, wherein the second dielectric layer has a thickness of between 500 to 20,000 Å.

* * * * *